(12) United States Patent
Hara et al.

(10) Patent No.: US 7,714,484 B2
(45) Date of Patent: May 11, 2010

(54) PIEZOELECTRIC RESONATOR AND MANUFACTURING METHOD THEREFOR

(75) Inventors: Akitoshi Hara, Fujimi (JP); Katsuo Ishikawa, Tatsuno (JP); Yukihiro Tonegawa, Minowa (JP)

(73) Assignee: Epson Toyocom Corporation (JP)

( * ) Notice: Subject to any disclaimer, the term of this patent is extended or adjusted under 35 U.S.C. 154(b) by 39 days.

(21) Appl. No.: 12/143,966

(22) Filed: Jun. 23, 2008

(65) Prior Publication Data

US 2009/0001856 A1 Jan. 1, 2009

(30) Foreign Application Priority Data

Jun. 28, 2007 (JP) ............................. 2007-170443

(51) Int. Cl.
*H01L 41/08* (2006.01)
(52) U.S. Cl. ........................ 310/348; 310/370; 310/344
(58) Field of Classification Search ................. 310/370, 310/344, 348; 333/193; *H01L 41/053, 41/08, H01L 41/09, 23/02; H03H 9/02*
See application file for complete search history.

(56) References Cited

U.S. PATENT DOCUMENTS

| | | | | |
|---|---|---|---|---|
| 7,557,491 B2 * | 7/2009 | Kigawa et al. | ............... | 310/344 |
| 7,602,107 B2 * | 10/2009 | Moriya et al. | ............... | 310/348 |
| 7,605,521 B2 * | 10/2009 | Kuwahara | ................... | 310/344 |

FOREIGN PATENT DOCUMENTS

JP 2005-191314 7/2005

* cited by examiner

*Primary Examiner*—Walter Benson
*Assistant Examiner*—Karen B Addison
(74) *Attorney, Agent, or Firm*—Harness, Dickey & Pierce, P.L.C.

(57) ABSTRACT

A piezoelectric resonator includes a piezoelectric resonator element having a base portion and a resonating arm extending from the base portion, a package including a bottom to which the piezoelectric resonator element is fixed and a frame wall that surrounds the bottom and having an opening above the bottom, and a lid for closing the opening of the package. In this piezoelectric resonator, the lid includes a main body having a through-hole formed therein, a flange formed to surround a periphery of the main body and to be thinner than the main body, and an optically transparent member located in the through-hole. The flange has a joining portion with an upper end surface of the frame wall, and the main body projects in a direction from the flange to the bottom in a thickness direction. Also, the through-hole is at a position displaced in a first direction approaching a first end of the main body from a center of the main body. Also, the flange is joined with the frame wall such that a clearance between the first end and the joining portion of the flange nearest to the first end is larger than a clearance between a second end in a second direction opposite to the first direction of the main body and the joining portion of the flange nearest to the second end.

7 Claims, 5 Drawing Sheets

PIEZOELECTRIC RESONATOR AND MANUFACTURING METHOD THEREFOR

BACKGROUND OF THE INVENTION

1. Technical Field

The present invention relates to a piezoelectric resonator and a manufacturing method therefor.

2. Related Art

It is known that a piezoelectric resonator element is fixed in a package and is sealed with a lid.

It is also known that a lid having a window member is used so as to allow the inside to be optically recognized after sealing (JP-A-2005-191314).

In the case where a lid is formed of metal and a window member is formed of glass, if the lid is deformed, the deformation tends to result in the breakage of the window member.

The breakage of a window member can occur not only during the process of joining a lid to a package but also after the joining of the lid to the package.

SUMMARY

An advantage of the invention is to prevent the breakage of a window member provided in a lid.

(1) A piezoelectric resonator according to a first aspect of the invention includes: a piezoelectric resonator element having a base portion and a resonating arm extending from the base portion; a package including a bottom to which the piezoelectric resonator element is fixed and a frame wall that surrounds the bottom, and having an opening above the bottom; and a lid for closing the opening of the package. The lid includes: a main body having a through-hole formed therein; a flange formed to surround a periphery of the main body and to be thinner than the main body; and an optically transparent member located in the through-hole. The flange has a joining portion with an upper end surface of the frame wall. The main body projects in a direction from the flange to the bottom in a thickness direction. The through-hole is at a position displaced in a first direction approaching a first end of the main body from a center of the main body. The flange is joined with the frame wall such that a clearance between the first end and the joining portion of the flange nearest to the first end is larger than a clearance between a second end in a second direction opposite to the first direction of the main body and the joining portion of the flange nearest to the second end.

According to the first aspect of the invention, in the lid, an end near the optically transparent member of the main body is apart from a portion of the flange joined to the frame wall.

The stress is absorbed in this portion, enabling the suppression of the breakage of the optically transparent member.

(2) In this piezoelectric resonator,
the flange may have a width in the first direction larger than a width in the second direction.

(3) In this piezoelectric resonator,
the lid may include a flange surface facing the package of the flange, a main body surface facing the package of the main body, and a connection surface connecting the flange surface with the main body surface, and
the connection surface may have a concave curved surface.

(4) In this piezoelectric resonator,
the connection surface may include a first connection portion connecting to a margin of the main body surface, a second connection portion connecting to the flange surface, and an intermediate portion between the first and second connection portions. At least the intermediate portion may be the concave curved surface, and at least part of the connection surface may be in contact with the frame wall.

(5) In this piezoelectric resonator,
the first connection portion may be connected perpendicularly to the main body surface.

(6) In this piezoelectric resonator,
the intermediate portion may be in contact with the frame wall.

(7) In this piezoelectric resonator,
the intermediate portion may be depressed from a margin of the main body surface; and
the first connection portion may be in contact with the frame wall and a space is present between the intermediate portion and the frame wall.

(8) A method for manufacturing a piezoelectric resonator according to a second aspect of the invention includes:

(a) preparing a package that includes a bottom and a frame wall surrounding the bottom and has an opening above the bottom;

(b) fixing to the bottom a piezoelectric resonator element having a base portion and a resonating arm extending from the base portion;

(c) preparing a lid that includes a main body having a through-hole formed therein, an optically transparent member located in the through-hole, and a flange formed to surround a periphery of the main body and to be thinner than a thickness of the main body, the main body projecting in a direction from the flange in a thickness direction;

(d) arranging the lid such that a portion projecting from the flange of the main body is inside the frame wall with a clearance from the frame wall and the flange overlaps the frame wall so as to close the opening of the package; and (e) joining the flange to the upper end surface of the frame wall by locally heating. The through-hole is at a position displaced in a first direction approaching a first end of the main body from a center of the main body. In step (d), the lid is arranged such that a clearance between the first end and a portion overlapping the frame wall closest to the first end of the flange is larger than a clearance between a second end in a second direction opposite to the first direction of the main body and a portion overlapping the frame wall nearest to the second end of the flange.

According to the second aspect of the invention, in the lid, an end near the optically transparent member of the main body is apart from a portion of the flange joined to the frame wall.

The stress is absorbed in this portion, enabling the suppression of the breakage of the optically transparent member.

(9) In this method for manufacturing a piezoelectric resonator, the lid may have a flange surface facing the package of the flange, a main body surface facing the package of the main body, and a connection surface connecting the flange surface with the main body surface.

In the step (d), at least part of the connection surface may be brought into contact with the frame wall.

(10) In this method for manufacturing a piezoelectric resonator,
the connection surface may include a first connection portion connecting to a margin of the main body surface, a second connection portion connecting to the flange surface, and an intermediate portion between the first and second connection portions. The intermediate portion may be depressed from the margin of the main body surface. In the step (d), the first connection portion may be brought into contact with the frame wall to form a space between the intermediate portion and the frame wall.

(11) In this method for manufacturing a piezoelectric resonator, in the step (d), after the second end in the second direction of the main body is arranged inside the frame wall with the lid inclined, the first end may be arranged inside the frame wall.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will be described.

Piezoelectric Resonator Element (Before Being Incorporated into Piezoelectric Resonator)

Figure 1:
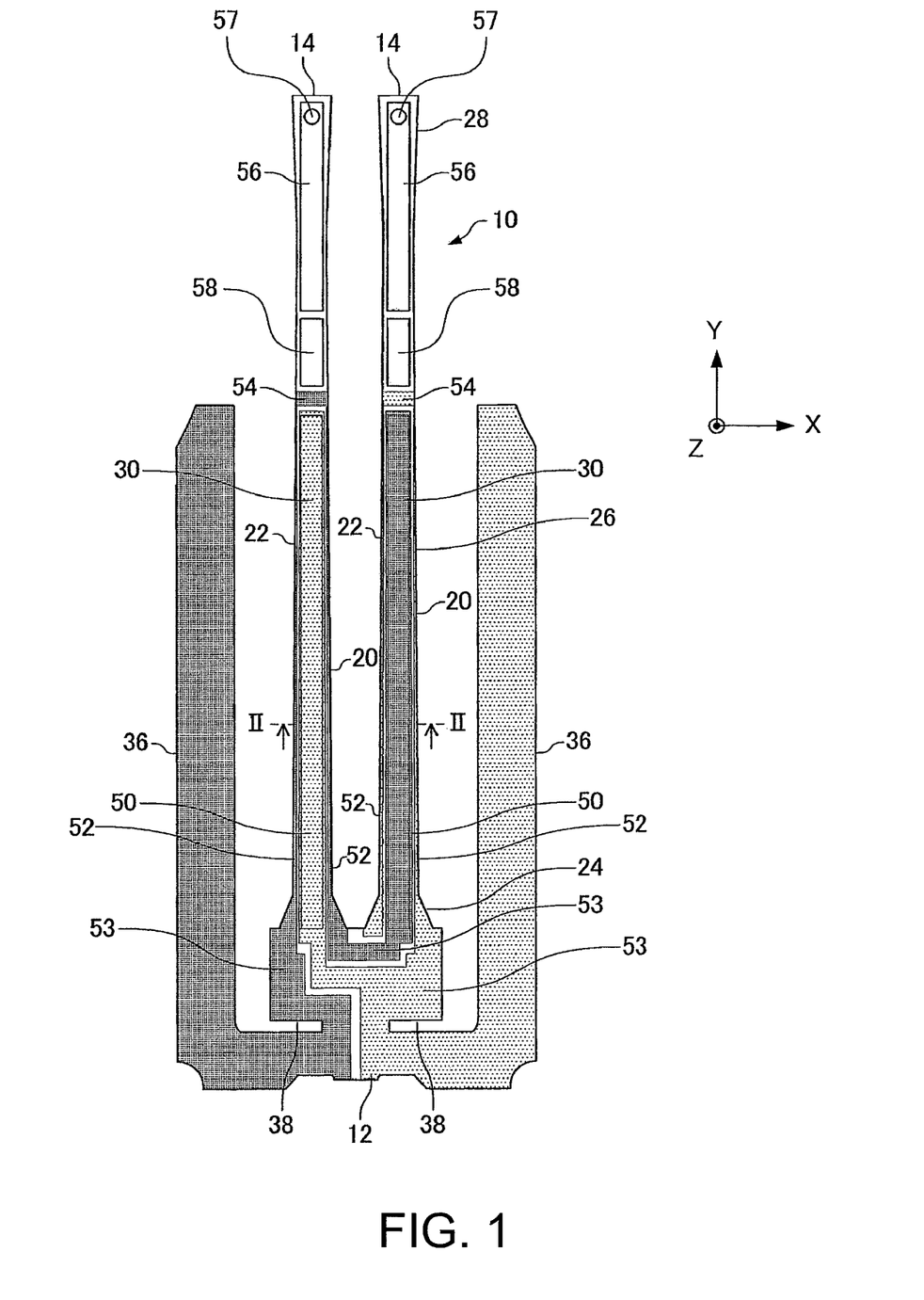
FIG. 1 is a plan view showing a piezoelectric resonator element (a tuning fork type piezoelectric resonator element) for use in a piezoelectric resonator according to an embodiment of the invention.

FIG. 1 is a plan view showing a piezoelectric resonator element (a tuning fork piezoelectric resonator element) for use in a piezoelectric resonator according to an embodiment of the invention.

Note that the bottom plan view and the plan view of a piezoelectric resonator element 10 are symmetrically represented.

The piezoelectric resonator element 10 is made of a piezoelectric material such as quartz crystal, lithium tantalate or lithium niobate.

The piezoelectric resonator element 10 includes a base portion 12 and a pair of resonating arms 14 extending from the base portion 12.

Figure 2:
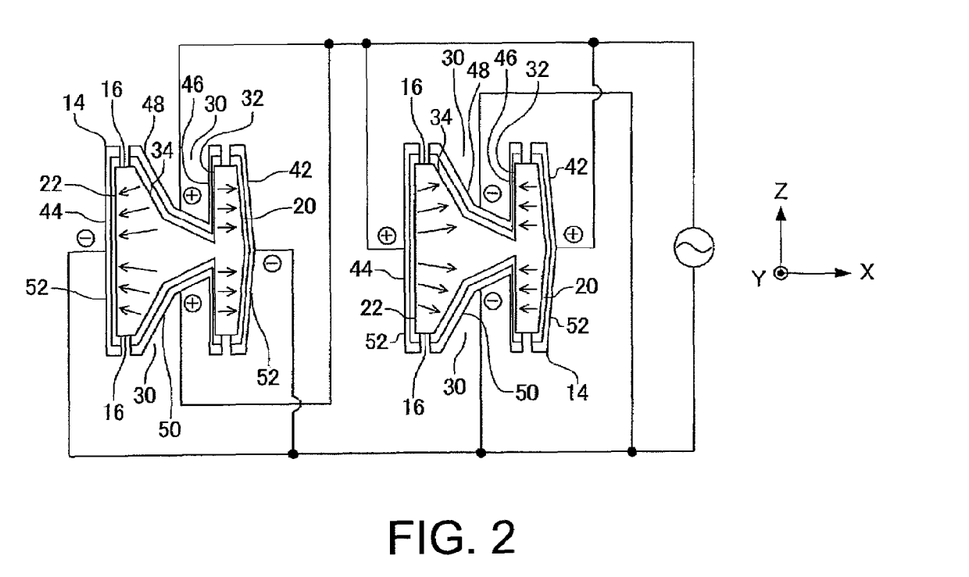
FIG. 2 is an enlarged sectional view taken along the line II-II of the piezoelectric resonator element shown in FIG. 1.

FIG. 2 is an enlarged sectional view taken along the line II-II of the piezoelectric resonator element 10 shown in FIG. 1.

The resonating arm 14 has front and back surfaces 16 facing opposite to each other and first and second side surfaces 20 and 22 connecting the front and back surfaces 16 on their both sides.

The first side surface 20 of one resonating arm 14 (on the left side in FIG. 1) and the second side surface 22 of the other resonating arm 14 (on the right side in FIG. 1) are arranged in parallel to face each other.

The first side surface 20 is formed into a mountain shape in which the thickness of the resonating arm 14 increases in directions towards the center.

The thickness of the resonating arm 14 is defined by a clearance between the front and back surfaces 16 (refer to FIG. 2).

The height of the mountain shape drawn in the first side surface 20 is more than 0% and 12.5% or less of the width of the resonating arm 14.

The width of the resonating arm 14 is defined by a clearance between the first and second side surfaces 20 and 22.

The width of the resonating arm 14 increases toward the base portion 12 in its root portion 24, which is connected to the base portion 12.

Accordingly, the resonating arm 14 is connected in its large-width portion to the base portion 12, resulting in having high rigidity.

The resonating arm 14 includes a first taper portion 26 in which the width defined by the clearance between the first and second side surfaces 20 and 22 decreases from the base portion 12 towards the leading end.

Forming the first taper portion 26 facilitates vibrations of the resonating arm 14.

The resonating arm 14 includes a second taper portion 28, which has a width increasing from the first taper portion 26 towards the leading end, at a position closer to the leading end than that of the first taper portion 26.

The second taper portion 28 functions as a weight, enabling the reduction of the vibration frequency.

The resonating arm 14 is formed such that a width change point at which the first and second taper portions 26 and 28 are connected is at a position closer to the leading end than that of a long groove 30.

In the resonating arm 14, the long groove 30 extending in the longitudinal direction is formed on each of the front and back surfaces 16.

The long groove 30 makes it easy for the resonating arm 14 to move, so that the resonating arm 14 efficiently vibrates.

This allows the reduction of the crystal impedance (CI) value.

The long groove 30 has a length equal to 50 to 70% of that of the resonating arm 14.

The long groove 30 has a width equal to 60 to 90% of that of the resonating arm 14.

The long groove 30 includes a first inner surface 32 extending to be disposed back to back with the first side surface 20, and a second inner surface 34 extending to be disposed back to back with the second side surface 22.

The first inner surface 32 is more perpendicular to the front and back surfaces 16 than the second inner surface 34 is.

The first inner surface 32 may be a flat surface.

The second inner surface 34 may also be a flat surface, but is composed of surfaces having different angles, which connect to each other, in the example shown in FIG. 2.

The first and second side surfaces 20 and 22 (regarding the angles of portions connecting to the front and back surfaces 16) are more perpendicular to the front and back surfaces 16 than the second inner surface 34 is.

The piezoelectric resonator element 10 includes a pair of support arms 36.

The pair of support arms 36 extend from the base portion 12 in directions that cross the extending direction of the pair of resonating arms 14 and that are opposite to each other, and bend and further extend in the extending direction of the pair of resonating arms 14.

Bending causes the reduction in size of the support arms 36.

The support arms 36 are portions attached to a package 60.

With the attachment of the support arms 36, the resonating arms 14 and the base portion 12 come to be in a state of floating.

In the base portion 12, a pair of cuts 38 are made in directions opposite to each other such that a shape having a narrow portion appears on surfaces on the same sides as those of the front and back surfaces 16 of the resonating arm 14.

The pair of cuts 38 are made in the base portion 12 to be adjacent to the pair of support arms 36 respectively on their sides of the direction along which the pair of support arms 36 extend from the base portion 12 and bend.

The cuts 38 block the transmission of vibrations of the resonating arm 14 to suppress the transmission of vibrations through the base portion 12 and the support arms 36 to the outside (vibration leakage), allowing an increase in CI value to be prevented.

The longer (deeper) is the length (depth) of the cuts 38 as far as the strength of the base portion 12 can be secured, the larger is the effect of suppressing vibration leakage.

The width between the pair of cuts 38 (width of a portion sandwiched by the pair of cuts 38) may be larger or smaller than the clearance between the first and second side surfaces 20 and 22 facing each other of the pair of resonating arms 14, and may be smaller or larger than the clearance of the first and second side surfaces 20 and 22 facing opposite to each other of the pair of resonating arms 14.

An excitation electrode film is formed on the resonating arm 14. The excitation electrode film may have a multilayer structure including a Cr film serving as an underlying film having a thickness of 100 Å or more and 300 Å or less and an Au film having a thickness of 200 Å or more and 500 Å or less formed on the Cr film.

The Cr film has high adhesion to quartz crystal and the Au film is resistant to oxidizing because of its low electric resistance.

The excitation electrode film includes first and second side surface electrode films 42 and 44 formed on the first and second side surfaces 20 and 22, respectively, and first and second inner surface electrode films 46 and 48 formed on the first and second inner surfaces 32 and 34, respectively.

The excitation electrode film constitutes first and second excitation electrodes 50 and 52.

The first excitation electrode 50 includes the first and second inner surface electrode films 46 and 48 formed in the long grooves 30.

The first and second inner surface electrode films 46 and 48 formed in one long groove 30 are formed to be continuous with each other, thus being electrically connected with each other.

The first and second inner surface electrode films 46 and 48 formed in the long groove 30 on one (e.g., front surface) of the front and back surfaces 16 are electrically connected with those formed in the long groove 30 on the other (e.g., back surface) of the front and back surfaces 16.

That is, a pair of first excitation electrodes 50 formed on each of the front and back surfaces 16 are electrically connected with each other.

A pair of first excitation electrodes 50 formed on one of the resonating arms 14 are connected with lead-out electrodes 53 formed respectively on the front and back surfaces 16 in the base portion 12.

These lead-out electrodes 53 are connected with the first and second side surface electrode films 42 and 44 of the other of the resonating arm 14, thereby establishing electrical connection.

The second excitation electrode 52 includes the first and second side surface electrode films 42 and 44.

The first and second side surface electrode films 42 and 44 are electrically connected.

The electrical connection is made in a portion free from the long groove 30 of the resonating arm 14 by a connection electrode 54 formed on at least one (or both) of the front and back surfaces 16.

The first excitation electrode 50 formed on one resonating arm 14 is electrically connected with the second excitation electrode 52 formed on the other resonating arm 14 through the lead-out electrode 53 on the base portion 12.

The lead-out electrodes 53 are formed up to the support arm 36 arranged adjacent to the resonating arm 14 where the second excitation electrode 52 is formed.

The lead-out electrodes 53 are formed on the front and back surfaces 16 (or further on the side surfaces) of the support arm 36.

On the support arm 36, the lead-out electrodes 53 can serve as electrical connection portions with the outside.

The resonating arm 14 has first and second metal film formation regions 56 and 58 on at least one of the front and back surfaces 16.

The front and back surfaces 16 refer to surfaces of a material constituting the resonating arm 14.

Metal films of the first and second metal film formation regions 56 and 58 are formed directly on the front and back surfaces 16, and the excitation electrode film is formed avoiding the first and second metal film formation regions 56 and 58.

The second metal film formation region 58 is formed to be more apart from the leading end of the resonating arm 14 than the first metal film formation region 56.

The metal film in the first metal film formation region 56 is formed to be thicker than that of the second metal film formation region 58.

The metal films in the first and second metal film formation regions 56 and 58 may be made to be continuous with each other, and further may serve as connection electrodes to establish connection with the first and second side surface electrode films 42 and 44.

The metal films in the first and second metal film formation regions 56 and 58 accomplish their roles as a weight for the resonating arm 14.

The weight of the weight can therefore be controlled by removing part of the metal films.

The vibration frequency of the resonating arm 14 decreases as the weight of the leading end of the resonating arm 14 increases, whereas the vibration frequency of the resonating arm 14 increases as the weight decreases.

By making use of this, frequency control can be performed.

Formed in the first metal film formation regions 56 are first metal film removal portions 57.

The front and back surfaces 16 of the resonating arm 14 are exposed in the first metal film removal portions 57.

Operations of Piezoelectric Resonator Element

In the present embodiment, voltage is applied between the first side surface electrode film 42 and the first inner surface electrode film 46, while voltage is applied between the second side surface electrode film 44 and the second inner surface electrode film 48.

This causes one side end of the resonating arm 14 to expand and the other side end to contract, so that the resonating arm 14 flexes and vibrates.

In other words, in one resonating arm 14, the first and second side surfaces 20 and 22 of the resonating arm 14 expand and contract by applying voltage between the first and second excitation electrodes 50 and 52, thus causing the resonating arm 14 to vibrate.

Note that it has been found that as the first and second excitation electrodes 50 and 52 become longer up to 70% of the resonating arm 14, their CI values decrease.

FIG. 2 explains operations of the piezoelectric resonator element 10 according to the embodiment.

As shown in FIG. 2, voltage is applied to the first and second excitation electrodes 50 and 52 of one resonating arm 14, while voltage is applied to the first and second excitation electrodes 50 and 52 of the other resonating arm 14.

Here, the first excitation electrode 50 and the second excitation electrode 52 are connected to an alternating-current power supply by cross-wiring to apply alternating voltage as drive voltage so that the first excitation electrode 50 of one resonating arm 14 (left side) and the second excitation electrode 52 of the other resonating arm 14 (right side) have the same potential (+potential in the example in FIG. 2) while the second excitation electrode 52 of one resonating arm 14 (left side) and the first excitation electrode 50 of the other resonating arm 14 (right side) have the same potential (−potential in the example in FIG. 2).

The applied voltage generates electric fields as shown by the arrows in FIG. 2, which excite the resonating arms 14 such that they vibrate in opposite phases to each other (such that the leading end sides of the resonating arms 14 move close to and apart from each other), thus generating flexural vibrations.

The alternating voltage is controlled for the resonating arms 14 to vibrate in the fundamental mode.

Piezoelectric Resonator

Figure 3:
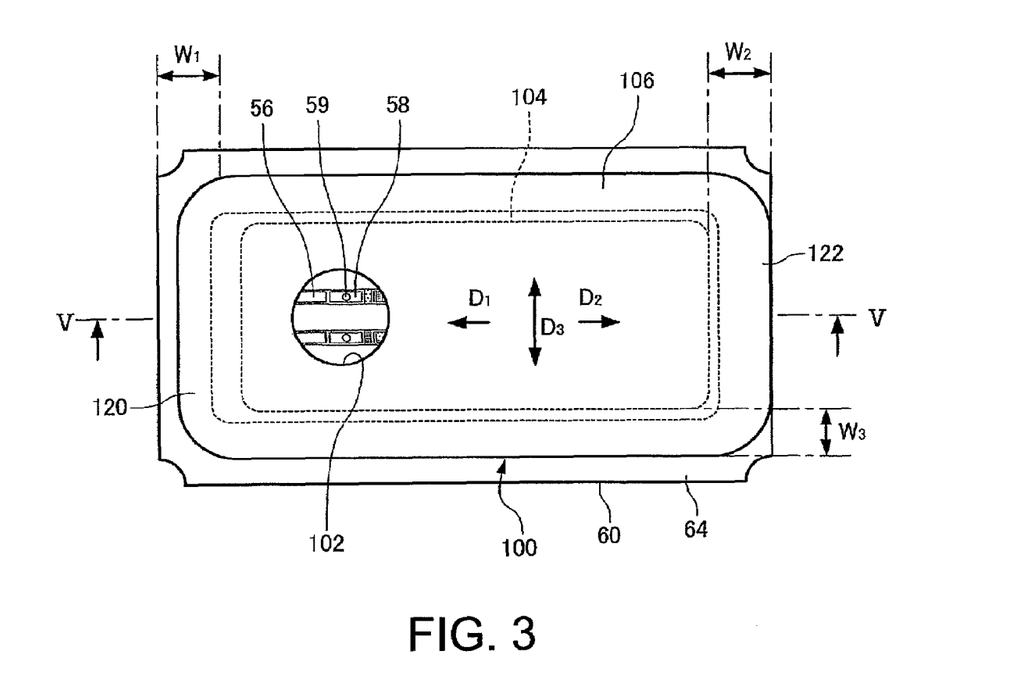
FIG. 3 is a plan view showing a piezoelectric resonator according to an embodiment of the invention.
Figure 4:
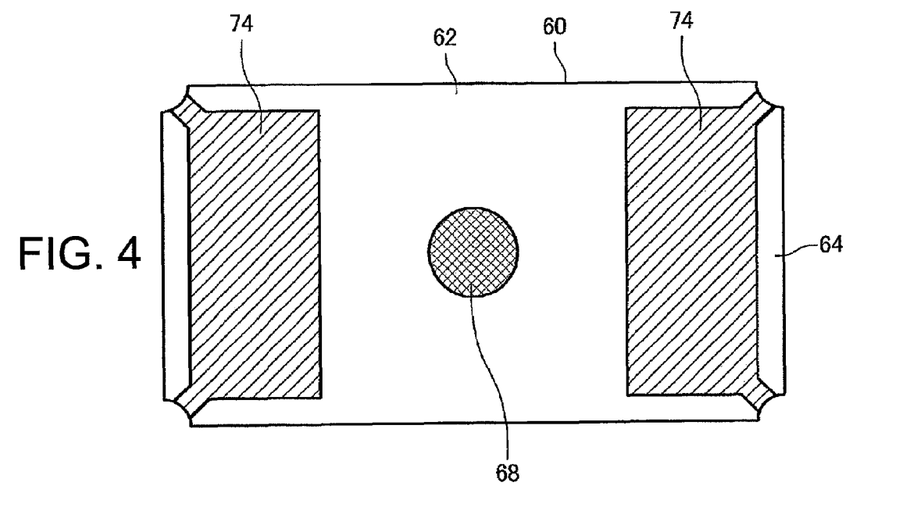
FIG. 4 is a bottom plan view of the piezoelectric resonator shown in FIG. 3.
Figure 5:
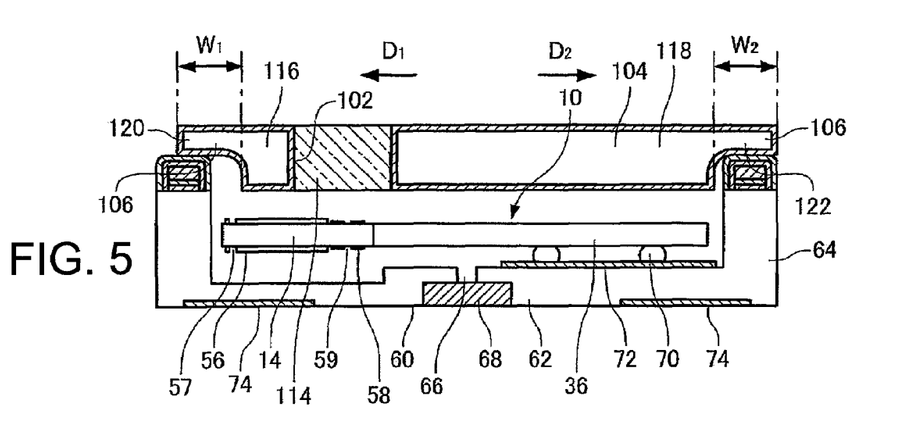
FIG. 5 is a sectional view taken along the line V-V of the piezoelectric resonator shown in FIG. 3.
Figure 6:
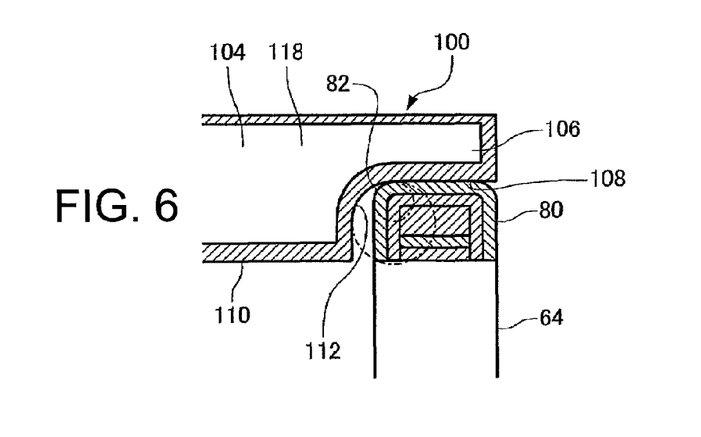
FIG. 6 is a partial enlarged view of the piezoelectric resonator shown in FIG. 5.

FIG. 3 is a plan view showing a piezoelectric resonator according to an embodiment of the invention, FIG. 4 is a bottom plan view of the piezoelectric resonator shown in FIG. 3, FIG. 5 is a sectional view taken along the line V-V of the piezoelectric resonator shown in FIG. 3, and FIG. 6 is a partial enlarged view of the piezoelectric resonator shown in FIG. 5.

In the piezoelectric resonator element 10 incorporated in the piezoelectric resonator, second metal film removal portions 59 are formed in metal films in the second metal film formation regions 58.

The front and back surfaces 16 of the resonating arm 14 are exposed in the second metal film removal portions 59.

The piezoelectric resonator has the package 60.

The package 60 includes a bottom 62, to which the piezoelectric resonator element 10 is fixed, and a frame wall 64 surrounding the bottom 62.

An air hole 66 for evacuating is formed in the bottom 62, and the air hole 66 is closed with a seal portion 68 made of a brazing material (such as AuGe).

The piezoelectric resonator element 10 is fixed to the bottom 62 of the package 60.

The piezoelectric resonator element 10 is fixed such that the resonating arms 14 extend from the base portion 12 towards the frame wall 64.

The support arms 36 are fixed to the bottom 62, thus causing the resonating arms 14 to be in a state of floating from the package 60.

An area facing the leading ends of the resonating arms 14 of the bottom 62 is made low, so that the resonating arms 14 when bending hardly come into contact with the bottom 62.

The lead-out electrodes 53 (refer to FIG. 1) on the support arms 36 are electrically connected with wiring 72 formed on the bottom 62 by using a conductive adhesive 70.

The wiring 72 is electrically connected with external electrodes 74 on the bottom surface of the package 60.

Note that the piezoelectric resonator element 10 has two support arms 36, and two external electrodes 74 are formed in the package 60.

The lead-out electrode 53 on one support arm 36 is electrically connected with one external electrode 74, while the lead-out electrode 53 on the other support arm 36 is electrically connected with the other external electrode 74.

The external electrodes 74 are electrically connected to and mounted on a circuit board (not shown) by soldering.

The entire package 60 may be formed of metal.

However, when the entire package 60 is formed mainly of nonmetal such as ceramics, the upper end surface of the frame wall 64 is metallized.

A seal ring 80 is provided on the non-metal portion of the frame wall 64.

In detail, a laminate composed of W (or Mo) film, an AgCu alloy film and a Kovar layer is provided, and a Ni film and an Au film are also provided in such a manner as to coat the side surfaces of the laminate and the top surface of the Kovar layer.

At least the Kovar layer (which may include other films) is referred to as the "seal ring 80".

The seal ring 80 means the upper end portion of the frame wall 64 (a member constituting the upper end surface) in the embodiment.

The seal ring 80 has a shape surrounding the bottom 62 without a cut.

The seal ring 80 is one for seam welding.

Fixed to the seal ring 80 is a lid 100.

The lid 100 includes the Kovar layer and the Ni layer coating this layer.

The back surface or the front surface of the lid 100 has a shape including four parallel sides (a rectangular shape or a rectangular shape with corners thereof cut away in straight lines or curves).

The lid 100 includes a main body 104 having a through-hole 102 formed therein and a flange 106 that surrounds the periphery of the main body 104 and is formed to be thinner than the main body 104.

The main body 104 projects from the flange 106 in the thickness (thickness defined by the front and back surfaces, and the same is true hereinafter) direction on at least one of the front and back surfaces through which the through-hole 102 passes.

The lid 100 has a flange surface 108 facing the package of the flange 106, a main body surface 110 facing the package of the main body 104, and a connection surface 112 connects the flange surface 108 with the main body surface 110.

The connection surface 112 includes a concave curved surface (depressed roundness), and the concave curved surface may be disposed between a pair of flat surfaces.

As shown in FIG. 6, the curvature radius of the connection surface 112 is larger than that of a roundness 82 of a portion connecting the inner side surface with the top end surface of the seal ring 80.

In the flange 106, a width W1 (the length of projecting from the main body 104, and the same is true hereinafter) in a first direction D1 is equal to a width W2 in a second direction D2.

The widths W1 and W2 in the first and second directions D1 and D2 are also equal to a width W3 (refer to FIG. 3) in a direction D3 orthogonal to the first and second directions D1 and D2.

An optically transparent member 114 is positioned in the through-hole 102.

The through-hole 102 has a circular opening shape.

The through-hole 102 is displaced in the first direction D1 approaching a first end 116 of the main body 104 from the center of the main body 104.

The lid 100 overlaps the package 60, to which the piezoelectric resonator element 10 is fixed, to close the opening of the package 60.

The flange 106 has a joining portion with the top surface of the frame wall 64.

The main body 104 of the lid 100 projects in a direction from the flange 106 towards the bottom 62 in the thickness direction.

The clearance between the first end 116 that the through-hole 102 of the main body 104 approaches and a joining portion 120 of the flange 106 closest to the first end 116 is larger than that between a second end 118 in the second direction D2 opposite to the first direction D1 of the main body 104 and a joining portion 122 of the flange 106 closest to the second end 118.

With this structure, the flange 106 is joined to the frame wall 64.

The optically transparent member 114 is arranged such that its bottom surface faces the second metal film formation region 58.

The inside of the package 60 sealed with the lid 100 is evacuated.

According to the embodiment, in the lid 100, the first end 116 close to the optically transparent member 114 of the main body 104 is apart from a joining portion of the flange 106 with the frame wall 64.

The stress is therefore absorbed in the flange 106, enabling suppression of breakage of the optically transparent member 114.

Figure 7:
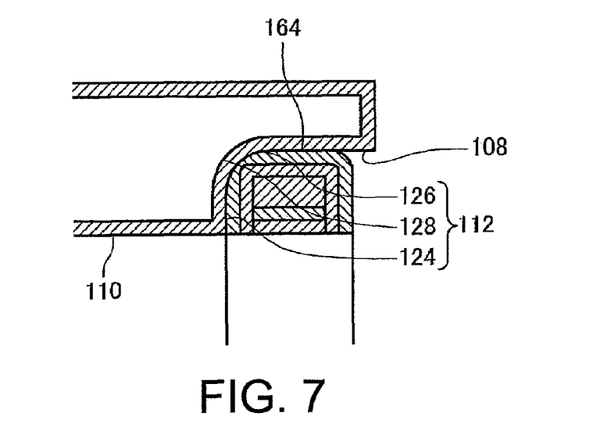
FIG. 7 shows a piezoelectric resonator according to a first modification of the present embodiment.

FIG. 7 shows a piezoelectric resonator according to a first modification of the present embodiment.

In this modification, the connection surface 112 includes a first connection portion 124 connecting with the margin of the main body surface 110, a second connection portion 126 connecting with the flange surface 108, and an intermediate portion 128 between the first and second connection portions 124 and 126.

At least the intermediate portion 128 is a concave curved surface.

At least part of the connection surface 112 (the first and second connection portions 124 and 126 as well as the intermediate portion 128 in the example of FIG. 7) is in contact with a frame wall 164 (e.g., seal ring).

The intermediate portion 128 is also in contact with the frame wall 164.

The first connection portion 124 is connected perpendicularly to the main body surface 110.

Description on the above embodiment is applicable to points other than this.

Figure 8:
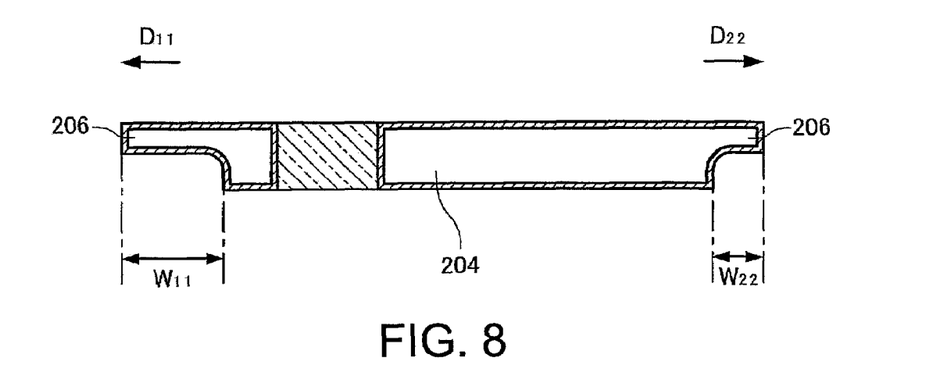
FIG. 8 shows a lid according to a second modification of the embodiment.

FIG. 8 shows a lid according to a second modification of the embodiment.

In this modification, a flange 206 has a width W11 in a first direction D11 (the length of projecting form a main body 204, and the same is true hereinafter), which is larger than a width W22 in a second direction D22.

Description on the above embodiment is applicable to points other than this.

Figure 9:
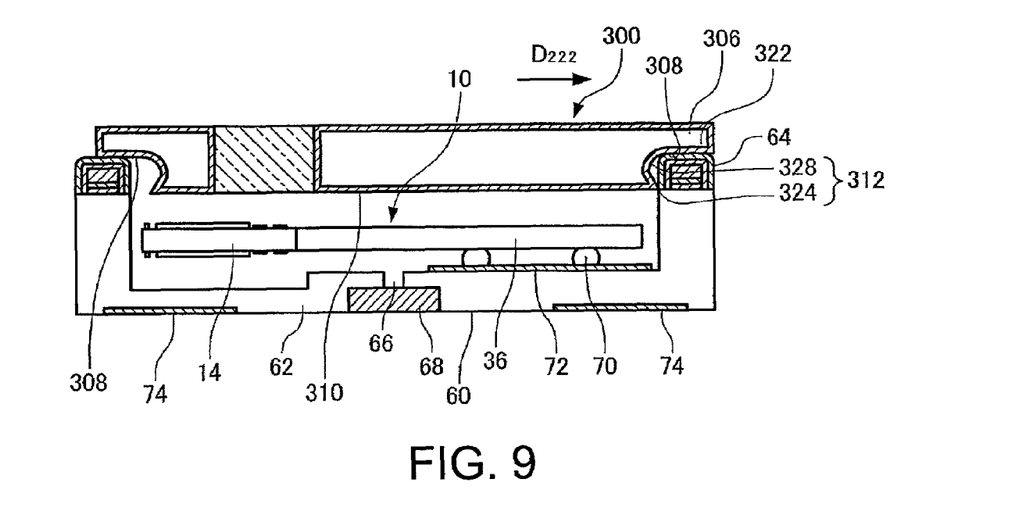
FIG. 9 shows a piezoelectric resonator according to a third modification of the embodiment.

FIG. 9 shows a piezoelectric resonator according to a third modification of the embodiment.

In this modification, in a lid 300, an intermediate portion 328, which is part of a connection surface 312 positioned between a main body surface 310 and a flange surface 308, is depressed from the margin of the main body surface 310.

In other words, the intermediate portion 328 is reversely tapered.

As a result, a first connection portion 324 (portion in contact with the margin of the main body surface 310) is into contact with the frame wall 64 and a space is present between the intermediate portion 328 and the frame wall 64.

Description on the above embodiment is applicable to points other than this.

Method for Manufacturing Piezoelectric Resonator

Figure 10:
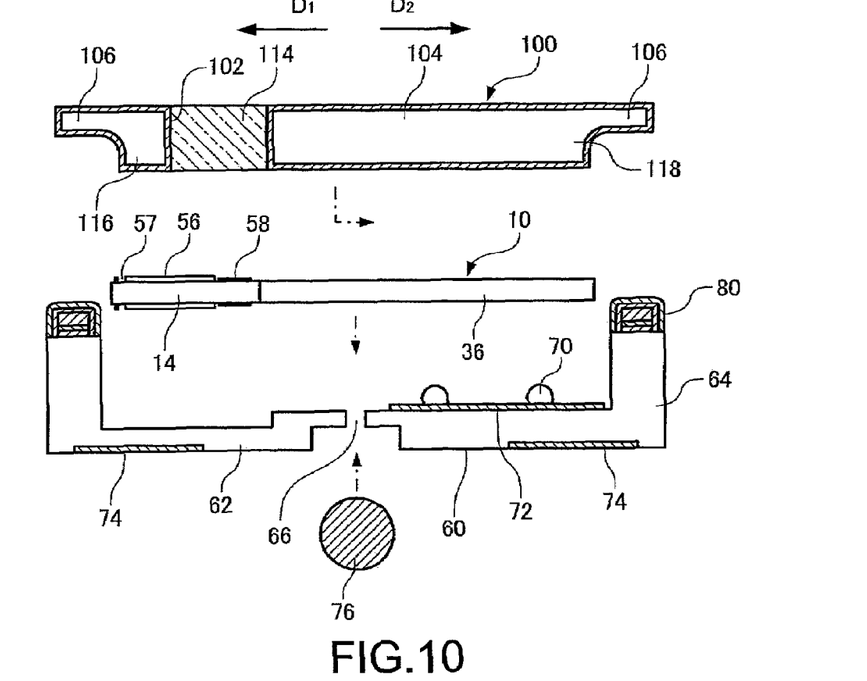
FIG. 10 explains a method for manufacturing a piezoelectric resonator according to an embodiment of the invention.

FIG. 10 explains a method for manufacturing a piezoelectric resonator according to another embodiment of the invention.

The method for manufacturing a piezoelectric resonator includes formation of the piezoelectric resonator element 10.

In the case of the piezoelectric resonator element 10 made of quartz crystal, a quartz crystal wafer is used, which is obtained as follows.

That is, a material is rotated clockwise in a range of 0 to 5 degrees around the Z axis in an orthogonal coordinate system composed of the X, Y and Z axes and is cut down to produce a quartz crystal Z plate, and then the quartz crystal Z plate is cut and polished into a predetermined thickness.

One quartz crystal wafer is cut down to a plurality of the piezoelectric resonator elements 10 being connected to one another, which are eventually cut to individual piezoelectric resonator elements 10.

The excitation electrode films and the metal films in the first and second metal film formation regions 56 and 58 are formed on the piezoelectric resonator elements 10.

A process of removing part of the metal film in the first metal film formation region 56 is performed before a process of fixing the piezoelectric resonator element 10 to the package 60.

That is, the frequency is controlled by removing part of the metal film in the first metal film formation region 56 (to form the first metal film removal portion 57) before the piezoelectric resonator element 10 is incorporated into a piezoelectric resonator (the removal may be before or after cutting a plurality of piezoelectric resonator elements 10 being connected to one another that have been cut out from a quartz crystal wafer into individual ones).

The removal of part of the metal film of the first metal film formation region 56 is performed with laser beams.

Its effect of facilitating the vibration of the resonating arm 14 (increasing the frequency) is large because the first metal film formation region 56 is positioned closer to the leading end of the resonating arm 14 than the second metal film formation region 58.

In addition, since the metal film in the first metal film formation region 56 is formed to have a thickness greater than that of the metal film in the second metal film formation region 58, the volume of the removed part in the first metal film formation region 56 is larger than that in the second metal film formation region 58 if the removed part in the both regions has the same area.

Accordingly, the effect is further large.

The frequency control process performed for the first metal film formation region 56 has a purpose of broad control, which can be referred to as "rough control".

Frequency control is already performed by removing part of the first metal film formation region 56 with laser beams before the piezoelectric resonator element 10 is attached to the package 60.

This allows the reduction of the amount of removing the metal film of the second metal film formation region 58 subsequently performed.

In the method for manufacturing a piezoelectric resonator, the package 60 is prepared.

Note that the seal ring 80 is fixed to the non-metal portion of the frame wall 64 of the package 60.

Then the piezoelectric resonator element 10 is fixed to the bottom 62.

The method for manufacturing a piezoelectric resonator includes a process of arranging the lid 100.

In detail, the lid 100 is arranged is such that a portion projecting from the flange 106 of the main body 104 is inside the frame wall 64 with a clearance from the frame wall 64 and the flange 106 overlaps the frame wall 64 so as to close the opening of the package 60.

The lid 100 is also arranged such that the bottom surface of the optically transparent member 114 faces the second metal film formation region 58.

In this process of arranging the lid 100, the first end 116 in the first direction D1 of the main body 104 may be arranged inside the frame wall 64 after the second end 118 in the second direction D2 of the main body 104 is arranged inside the frame wall 64 with the lid 100 inclined.

The method for manufacturing a piezoelectric resonator includes a process of joining the flange 106 onto the top surface of the frame wall 64 by locally heating. Joining is performed by seam welding.

In this way, the opening of the package 60 is closed with the lid 100.

Since the lid 100 is joined by seam welding, the whole heating is not performed although local heating is performed.

Therefore, there is little distortion caused by heat in the piezoelectric resonator element 10.

For this reason, frequency control requires removing a small amount of the metal film in the second metal film formation region 58, which results in generating a small amount of gas.

Note that in order to suppress distortion of the optically transparent member 114, the optically transparent member 114 is positioned apart from a portion where seam welding is performed.

Note that in the modification shown in FIG. 9, a space between the intermediate portion 328 and the frame wall 64 in a second direction D222 is sealed with a joining portion 322 of a flange 306 with the frame wall 64 and a contact portion between a first connection portion 324 and the frame wall 64.

A gas generated during the joining of the flange 306 with the frame wall 64 can be trapped in this space.

According to the embodiment, in the lid 100, an end close to the optically transparent member 114 of the main body 104 is apart from a portion of the flange 106 joined with the frame wall 64.

When joining of the lid 100 is performed, this portion can absorb the stress, enabling suppression of the breakage of the optically transparent member 114.

After the opening of the package 60 is closed with the lid 100, the inside of the package 60 closed by the lid 100 is evacuated through the air hole 66 formed in the package 60, and then the air hole 66 is closed with a brazing material 76.

Further, the method for manufacturing a piezoelectric resonator further includes a process of removing part of the metal film in the second metal film formation region 58.

This process is performed after the opening of the package 60 is closed with the lid 100 (e.g., further after the process of evacuating).

This process is performed by applying laser beams to the second metal film formation region 58 through the optically transparent member 114.

The second metal film formation region 58 is more apart from the leading end of the resonating arm 14 than the metal film of the first metal film formation region 56.

Accordingly, the effect of facilitating vibration of the resonating arm 14 (increasing the frequency) is small.

However, on the other hand, this allows fine control.

In addition, since the metal film in the second metal film formation region 58 is formed to have a thickness less than that of the metal film in the first metal film formation region 56, the volume of the removed part in the second metal film formation region 58 is smaller than that in the first metal film formation region 56 if the removed parts in both regions has the same area.

Accordingly, the effect of fine control is further large.

The method for manufacturing a piezoelectric resonator according to the embodiment includes the foregoing processes and further includes manufacturing processes that are self-evident from the structure of the above-described piezoelectric resonator.

Figure 11:
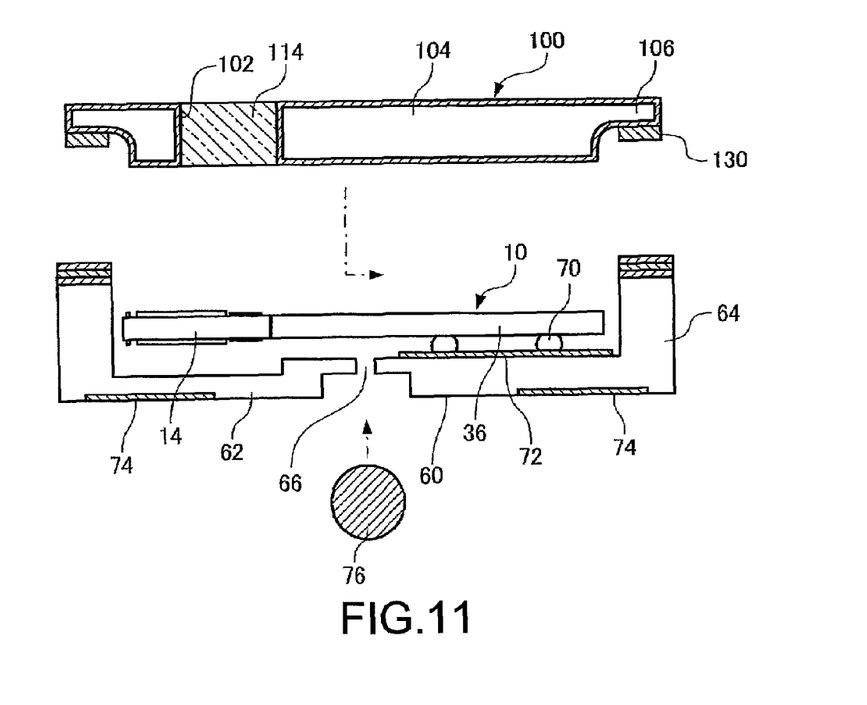
FIG. 11 explains a method for manufacturing a piezoelectric resonator according to a fourth modification of the embodiment of the invention.

FIG. 11 explains a method for manufacturing a piezoelectric resonator according to a fourth modification of the embodiment of the invention.

In this modification, laser beams or electron beams are used instead of the aforementioned seam welding.

In this case, a W (Mo) film, a Ni film and an Au film are laminated on a non-metal portion of the frame wall 64, instead of the aforementioned seal ring 80, and a brazing material 130 (e.g., AgCu) is provided on the flange 106.

Joining by the use of laser beams or electron beams is also joining by local heating. Other contents are the same as explained in the above embodiment.

Applications of Piezoelectric Resonator

Oscillators and sensors can be made using the above-described piezoelectric resonator.

With an oscillator using an oscillation circuit including a piezoelectric resonator, alternate current signals having high frequency accuracy can be obtained.

A sensor using a piezoelectric resonator detects a physical quantity utilizing the fact that the frequency of the piezoelectric resonator element 10 varies in accordance with the physical quantity.

Examples of such a sensor include sensors that detect temperature, stress generated by acceleration and Coriolis force generated by angular velocity.

It should be understood that the present invention is not limited to the above-described embodiment, but various changes and modifications can be made.

For example, the invention includes structures substantially the same as that described in the embodiment (e.g., structures having the same function, method and result or structures having the same object and result).

The invention also includes structures in which an unsubstantial portion in the structure described in the embodiment is replaced.

The invention also includes structures that have the same effect or that can achieve the same object as that described in the embodiment.

The invention also includes structures in which a publicly known technique is added to the structure described in the embodiment.

The entire disclosure of Japanese Patent Application No. 2007-170443, filed Jun. 6, 2007 is expressly incorporated by reference herein.

What is claimed is:

1. A piezoelectric resonator, comprising:
    a piezoelectric resonator element having a base portion and a resonating arm extending from the base portion;
    a package including a bottom to which the piezoelectric resonator element is fixed and a frame wall that surrounds the bottom and having an opening above the bottom; and
    a lid for closing the opening of the package, the lid including:
        a main body having a through-hole formed therein;
        a flange formed to surround a periphery of the main body and to be thinner than the main body; and
        an optically transparent member located in the through-hole, wherein:
    the flange has a joining portion with an upper end surface of the frame wall; the main body projects in a direction from the flange to the bottom in a thickness direction;
    the through-hole is at a position displaced in a first direction approaching a first end of the main body from a center of the main body; and
    the flange is joined with the frame wall such that a clearance between the first end and the joining portion of the flange nearest to the first end is larger than a clearance between a second end in a second direction opposite to the first direction of the main body and the joining portion of the flange nearest to the second end.

2. The piezoelectric resonator according to claim 1, wherein the flange has a width in the first direction larger than a width in the second direction.

3. The piezoelectric resonator according to claim 1, wherein:
    the lid includes a flange surface facing the package of the flange, a main body surface facing the package of the main body, and a connection surface connecting the flange surface with the main body surface; and
    the connection surface has a concave curved surface.

4. The piezoelectric resonator according to claim 3, wherein:
    the connection surface includes a first connection portion connecting to a margin of the main body surface, a second connection portion connecting to the flange surface, and an intermediate portion between the first and second connection portions;
    at least the intermediate portion is the concave curved surface; and
    at least part of the connection surface is in contact with the frame wall.

5. The piezoelectric resonator according to claim 4, wherein the first connection portion is connected perpendicularly to the main body surface.

6. The piezoelectric resonator according to claim 4, wherein the intermediate portion is in contact with the frame wall.

7. The piezoelectric resonator according to claim 4, wherein:
    the intermediate portion is depressed from a margin of the main body surface; and
    the first connection portion is in contact with the frame wall and a space is present between the intermediate portion and the frame wall.

\* \* \* \* \*